US008803131B2

(12) United States Patent
Lin et al.

(10) Patent No.: US 8,803,131 B2
(45) Date of Patent: Aug. 12, 2014

(54) METAL-FREE INTEGRATED CIRCUITS COMPRISING GRAPHENE AND CARBON NANOTUBES

(75) Inventors: Yu-Ming Lin, Yorktown Heights, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 7 days.

(21) Appl. No.: 13/604,254

(22) Filed: Sep. 5, 2012

(65) Prior Publication Data

US 2012/0326129 A1 Dec. 27, 2012

Related U.S. Application Data

(62) Division of application No. 12/614,724, filed on Nov. 9, 2009.

(51) Int. Cl.
*H01L 29/78* (2006.01)

(52) U.S. Cl.
USPC .......... 257/29; 257/24; 257/27; 257/E21.411; 257/E29.168; 438/151; 977/734; 977/938

(58) Field of Classification Search
USPC ...................... 257/24, 27, E21.411, E29.168; 438/151; 977/734, 938
See application file for complete search history.

(56) References Cited

U.S. PATENT DOCUMENTS

| 5,640,049 | A | 6/1997 | Rostoker et al. |
| 5,756,395 | A | 5/1998 | Rostoker et al. |
| 6,740,910 | B2 | 5/2004 | Roesner et al. |
| 6,803,260 | B2 | 10/2004 | Shin et al. |
| 6,933,222 | B2 | 8/2005 | Dubin et al. |
| 7,015,142 | B2 | 3/2006 | DeHeer et al. |

(Continued)

FOREIGN PATENT DOCUMENTS

| JP | 2007335532 A | 12/2007 |
| WO | 2006007819 A1 | 1/2006 |
| WO | 2007082854 A1 | 7/2007 |
| WO | 2009023349 A2 | 2/2009 |

OTHER PUBLICATIONS

Avouris et al., "Carbon-Based Electronics," Nature Nanotechnology, vol. 2, pp. 1-11 (Oct. 2007).

(Continued)

*Primary Examiner* — Lynne Gurley
*Assistant Examiner* — Vernon P Webb
(74) *Attorney, Agent, or Firm* — Cantor Colburn LLP; Vazken Alexanian

(57) ABSTRACT

An integrated circuit includes a graphene layer, the graphene layer comprising a region of undoped graphene, the undoped graphene comprising a channel of a transistor, and a region of doped graphene, the doped graphene comprising a contact of the transistor; and a gate of the transistor, the gate comprising a carbon nanotube film. A method of fabricating an integrated circuit comprising graphene and carbon nanotubes, includes forming a graphene layer; doping a portion of the graphene layer, resulting in doped graphene and undoped graphene; forming a carbon nanotube film; and etching the carbon nanotube film to form a gate of a transistor, wherein the transistor further comprises a channel comprising the undoped graphene and a contact comprising the doped graphene. A transistor includes a gate, the gate comprising a carbon nanotube film; a channel, the channel comprising undoped graphene; and a contact, the contact comprising doped graphene.

7 Claims, 10 Drawing Sheets

(56) References Cited

U.S. PATENT DOCUMENTS

| | | | |
|---|---|---|---|
| 7,094,679 B1 | 8/2006 | Li et al. | |
| 7,332,810 B2 | 2/2008 | Awano | |
| 7,335,603 B2 | 2/2008 | Mancevski | |
| 7,348,675 B2 | 3/2008 | Dubin et al. | |
| 7,619,257 B2 | 11/2009 | Pfeiffer | |
| 2004/0224490 A1* | 11/2004 | Wei et al. | 438/585 |
| 2004/0253805 A1* | 12/2004 | Dubin et al. | 438/618 |
| 2004/0253820 A1 | 12/2004 | DeHeer et al. | |
| 2005/0156320 A1 | 7/2005 | Mastromatteo | |
| 2005/0212014 A1 | 9/2005 | Horibe et al. | |
| 2005/0266605 A1 | 12/2005 | Kawakami | |
| 2006/0160372 A1* | 7/2006 | Dorfman | 438/761 |
| 2006/0255395 A1 | 11/2006 | Fujita et al. | |
| 2006/0290343 A1 | 12/2006 | Crafts et al. | |
| 2007/0102111 A1 | 5/2007 | Monsma et al. | |
| 2007/0166997 A1 | 7/2007 | Knorr | |
| 2007/0205450 A1 | 9/2007 | Okita | |
| 2007/0210883 A1 | 9/2007 | Beer et al. | |
| 2007/0287011 A1* | 12/2007 | DeHeer | 428/411.1 |
| 2008/0111164 A1 | 5/2008 | Awano | |
| 2008/0119016 A1 | 5/2008 | Dubin et al. | |
| 2008/0312088 A1 | 12/2008 | Chung et al. | |
| 2009/0020764 A1 | 1/2009 | Anderson et al. | |
| 2009/0140801 A1 | 6/2009 | Ozyilmaz et al. | |
| 2009/0294814 A1 | 12/2009 | Assefa et al. | |
| 2010/0006823 A1 | 1/2010 | Anderson et al. | |
| 2010/0051897 A1 | 3/2010 | Chen et al. | |
| 2010/0051960 A1 | 3/2010 | Chen et al. | |
| 2010/0102292 A1 | 4/2010 | Hiura et al. | |
| 2010/0144104 A1 | 6/2010 | Okita | |
| 2011/0108802 A1 | 5/2011 | Lin et al. | |
| 2011/0284818 A1 | 11/2011 | Avouris et al. | |

OTHER PUBLICATIONS

Cao et al., "Medium-Scale Carbon Nanotube Thin-Film Integrated Circuits on Flexible Plastic Substrates," Nature, vol. 454, pp. 1-8 (Jul. 2008).

Chen et al., "Improved Manufacturability of Cu Bond Pads and Implementation of Seal Design in 3D Integrated Circuits and Packages," 23rd International VLSI Multilevel Interconnection (VMIC) Conference, Fremont CA pp. 25-28 (2006).

Chen, et al., "Structure, Design and Process Control for Cu Bonded Interconnects in 3D Integrated Circuits," International Electron Devices Meeting (IEDM), pp. 367-370 (2006).

Close et al., "A 1 GHz Integrated Circuit with Carbon Nanotube Interconnects and Silicon Transistors," Nano Letters, vol. 8, No. 2, 706-709 (2008).

Falkovsky, "Unusual Field and Temperature Dependence of the Hall Effect in Graphene," Physical Review B (Condensed Matter and Materials Physics), vol. 75, No. 3, pp. 33409-1-33409-4 (2007).

Fiori et al., "Simulation of Graphene Nanoribbon Field-Effect Transistors," IEEE Electron Device Letters, v. 28, No. 8, pp. 760-762 (Aug. 2007).

Geim et al., "The Rise of Graphene," Nature Materials, vol. 6, pp. 1-14 (Mar. 2007).

IMEC, [online]; [retrieved on Jun. 11, 2009]; retrieved from the Internet http://www.semiconductor.net/article/print/279085-IMEC_Tips_10_nm_Options_at_Tech_Forum.php IMEC, "Tips 10 nm Options at Tech Forum," Laura Peters, Semiconductor International, Jun. 2009, pp. 1-3.

Liu et al., "Fabrication of Graphene p-n-p Junctions with Contactless Top Gates," Applied Physical Letters, v. 92, No. 20, pp. 203103-1-203103-3 (2008).

Meric et al., "Hybrid Carbon Nanotube-Silicon Complementary Metal Oxide Semiconductor Circuits," J. Vac. Sci. Technol. B 25(6) p. 2577-80 (Nov./Dec. 2007).

Ploszl et al.,"Wafer Direct Bonding Tailoring Adhesion Between Brittle Materials," Materials Science and Enginnering; Reports: A Review Journal, Elsevier, vol. R 25, No. 1-2, Mar. 1999, pp. 1-88.

Ragheb, T. et al., Investigating the Impact of Carbon Nanotube-Based Driver Transistors on the Performance of Single-Walled Carbon Nanotube Interconnect, 51st Midwest Symposium on Circuits and Systems, Aug. 10-13, 2008, pp. 866-869, IEEE.

Seminov et al., "Spin Field Effect Transistor with a Graphene Channel," Applied Physics Letters, vol. 91, No. 15, pp. 153105-1-153105-3 (2007).

Song, "Fabrication and Characterization of Nonpatterned Epitaxial Graphene Films for Carbon Based Electronics," Dissertation, Georgia Institute of Technology School of Physics, pp. 1-142 (Dec. 2006).

Tsai et al., "Selective Carbon Nanotube Growth on Silicon Tips with the Soft Electrostatic Force Bonding and Catalyst Transfer Concepts," Nanotechnology 16; pp. 1-4 (2005).

Zhou et al., "A Method of Printing Carbon Nanotube Thin Films," Applied Physics Letters 88, 123109, pp. 1-3 (2006).

J. Zhu et al.,"A Novel Graphene Channel Field Effect Transistor with Schottky Tunneling Source and Drain," IEEE, pp. 1-4 (2007).

* cited by examiner

700a

700b

1000

```
FORM GRAPHENE LAYER ON SUBSTRATE
1001
```

```
ETCH GRAPHENE LAYER
1002
```

```
DOPE PORTION OF GRAPHENE LAYER
1003
```

```
FORM DIELETRIC LAYER ON GRAPHENE LAYER
1004
```

```
ETCH DIELECTRIC LAYER
1005
```

```
FORM CARBON NANOTUBE FILM
1006
```

```
ETCH CARBON NANOTUBE FILM
1007
```

METAL-FREE INTEGRATED CIRCUITS COMPRISING GRAPHENE AND CARBON NANOTUBES

CROSS-REFERENCE TO RELATED APPLICATION

This application is a divisional of U.S. patent application Ser. No. 12/614,724, filed Nov. 9, 2009, the disclosure of which is incorporated by reference herein in its entirety.

FIELD OF INVENTION

This disclosure relates generally to the field of semiconductor chip fabrication.

BACKGROUND OF RELATED ART

In semiconductor chips comprising complementary metal oxide on semiconductor (CMOS) integrated circuits, circuit contacts and interconnects may be fabricated from various metals, such as lead (Pb) or gold (Au). High volume production of semiconductor chips containing these metals may result in environmental pollution, as such metals may be inherently environmentally unfriendly, and may be hazardous to the environment if discarded products containing the semiconductor chips are not disposed of properly. The use of metal in semiconductor chips may also constrain fabrication process conditions, for example, limiting maximum process temperatures and presenting problems with tool cross-contamination.

SUMMARY

In one aspect, an integrated circuit includes a graphene layer, the graphene layer comprising a region of undoped graphene, the undoped graphene comprising a channel of a transistor, and a region of doped graphene, the doped graphene comprising a contact of the transistor; and a gate of the transistor, the gate comprising a carbon nanotube film.

In one aspect, a method of fabricating an integrated circuit comprising graphene and carbon nanotubes, includes forming a graphene layer; doping a portion of the graphene layer, resulting in doped graphene and undoped graphene; forming a carbon nanotube film; and etching the carbon nanotube film to form a gate of a transistor, wherein the transistor further comprises a channel comprising the undoped graphene and a contact comprising the doped graphene.

In one aspect, a transistor includes a gate, the gate comprising a carbon nanotube film; a channel, the channel comprising undoped graphene; and a contact, the contact comprising doped graphene.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of systems and methods for integrated circuits comprising graphene and carbon nanotubes are provided, with exemplary embodiments being discussed below in detail.

Integrated circuits comprising graphene and carbon nanotubes allow fabrication of metal-free monolithic electronic devices. Graphene comprises a one-atom thick sheet of carbon atoms packed in a honeycomb lattice structure, and has a relatively high carrier mobility and current capacity. Doped graphene possesses a conductivity that is higher than the conductivity of undoped graphene. Undoped graphene may form a channel region of a transistor, and doped graphene may form contacts and interconnects. Graphene circuit interconnects may have a lower stray capacitance than metal wires. A dielectric and a carbon nanotube thin film may be disposed on a graphene layer. The carbon nanotubes may form circuit vias and top-layer interconnects. The completed integrated circuit comprises carbon and oxide materials, resulting in transparent and flexible circuits that may be easily stacked to produce multilayer circuits that are environmentally friendly. In addition, constraints on process integration caused by use of metals, such as limited thermal budget and tool cross-contamination, may be eliminated.

Figure 1A:
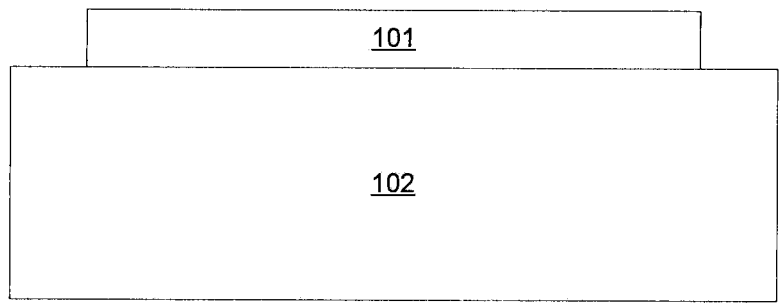
FIGS. 1A and 1B illustrate a cross section and a top view, respectively, of an embodiment of an integrated circuit comprising graphene and carbon nanotubes after formation of a graphene layer(s).
Figure 1B:
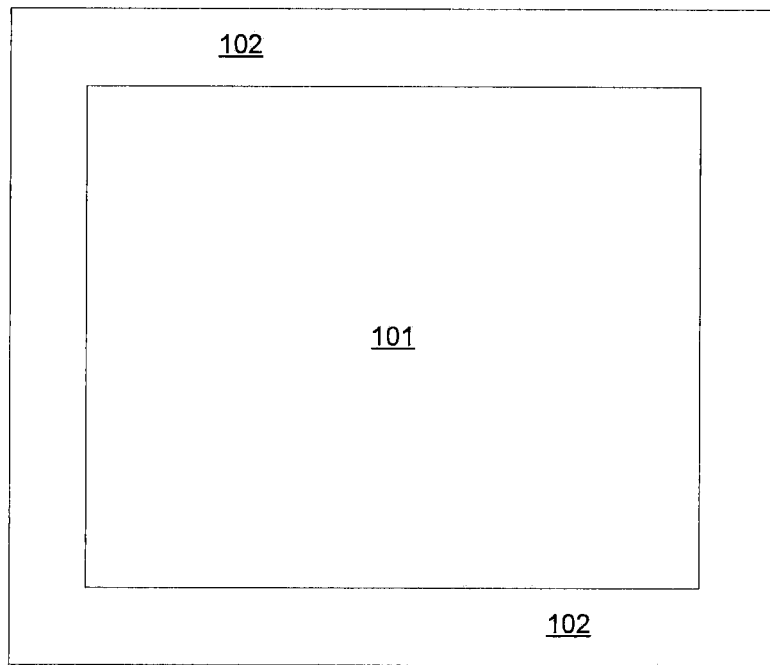

FIGS. 1A and 1B illustrate a cross section 100a and a top view 100b of an embodiment of an integrated circuit comprising graphene and carbon nanotubes after formation (e.g., by growing, deposition, etc.) of a graphene layer or few graphene layers 101. Graphene layer 101 is disposed on substrate 102. Graphene 101 may be formed in any appropriate manner, including, but not limited to, heating of silicon carbide. Graphene layer 101 may comprise between about 1 and 20 sheets of graphene stacked on top of each other in some embodiments; therefore, the thickness of graphene layer 101 may range from about 1 atom thick to about 20 atoms thick, equivalent to a range of about 0.35 nanometers (nm) to about 7 nm thick. Substrate 102 may comprise any appropriate oxide material, including, but not limited to, hafnium oxide, silicon oxide, or aluminum oxide.

Figure 2:
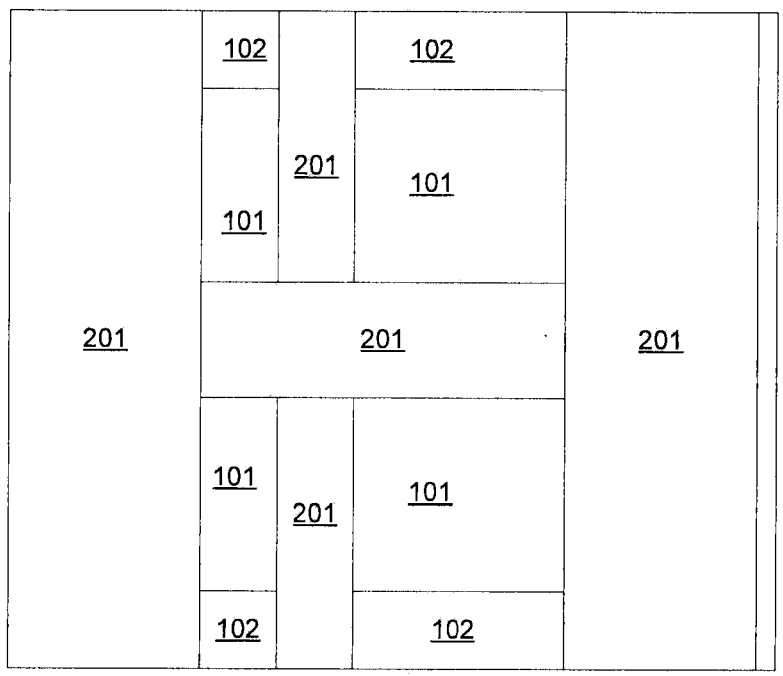
FIG. 2 illustrates a top view of an embodiment of an integrated circuit comprising graphene and carbon nanotubes after application of mask material.

FIG. 2 illustrates a top view 200 of an embodiment of an integrated circuit comprising graphene and carbon nanotubes after a mask material 201 is applied on top of graphene layer 101 and substrate 102, and lithographically patterned. Mask material 201 may comprise polymethyl methacrylate (PMMA) in some embodiments. The unmasked graphene 101 is then etched. Etching may be performed using oxygen plasma in some embodiments.

Figure 3:
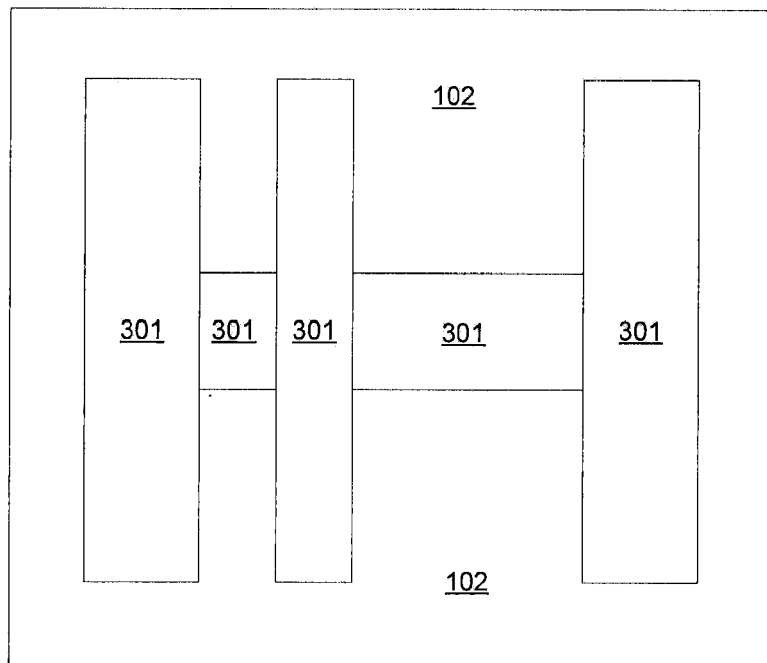
FIG. 3 illustrates a top view of an embodiment of an integrated circuit comprising graphene and carbon nanotubes after etching regions of the graphene layer(s) and removal of the mask material.

FIG. 3 illustrates a top view 300 of an embodiment of an integrated circuit comprising graphene and carbon nanotubes after etching of the exposed graphene 101 and removal of the mask material 201. The mask material 201 of FIG. 2 has been removed, resulting in etched graphene region 301 disposed on substrate 102.

Figure 4:
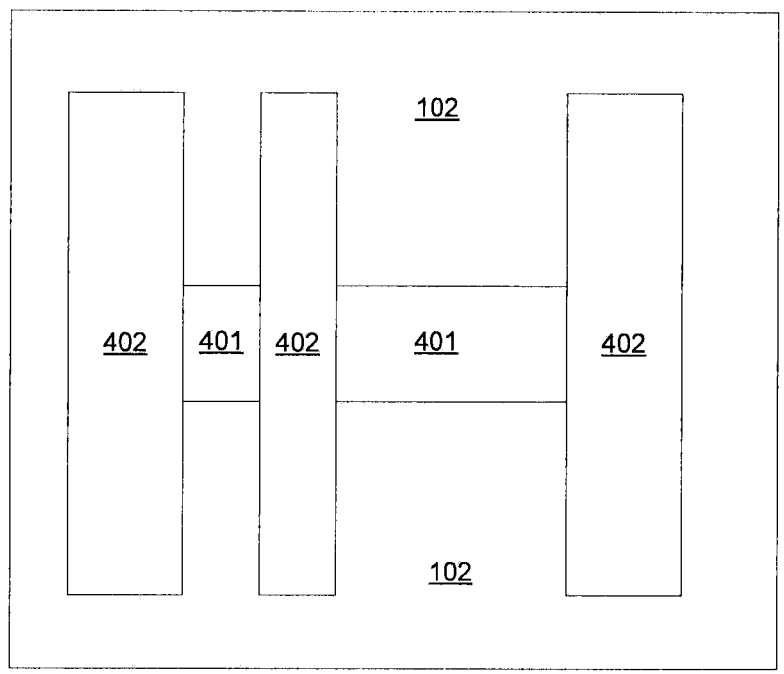
FIG. 4 illustrates a top view of an embodiment of an integrated circuit comprising graphene and carbon nanotubes after doping of a portion of the graphene.

FIG. 4 illustrates a top view 400 of an embodiment of an integrated circuit comprising graphene and carbon nanotubes after doping of a portion of graphene region 301. A mask (not shown) has been applied to a portion of etched graphene region 301, and the uncovered portion of the etched graphene region 301 has been doped, resulting in undoped graphene 401 and doped graphene 402. The mask (not shown) is then removed. Doped graphene 402 may be doped with any appropriate material, including but not limited to organic molecules such as polyethyleneimine (PEI) or diazonium. Doped graphene 402 has a higher conductivity than undoped graphene 401. Doped graphene 402 comprises transistor contacts and interconnects, and undoped graphene 401 comprises transistor channel regions.

Figure 5:
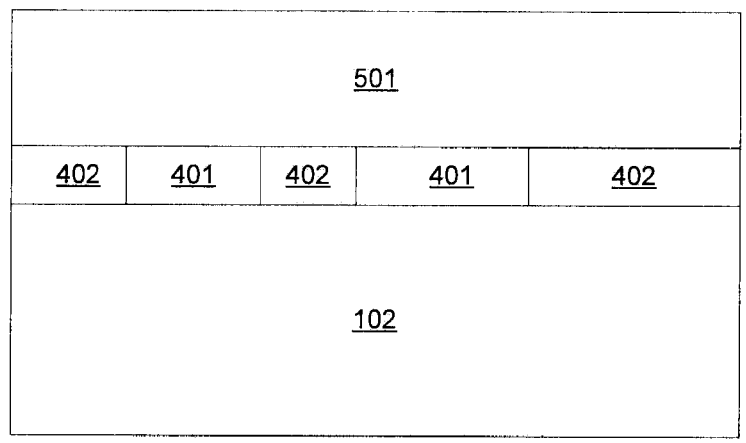
FIG. 5 illustrates a cross section of an embodiment of an integrated circuit comprising graphene and carbon nanotubes after formation of a dielectric layer.

FIG. 5 illustrates a cross section 500 of an embodiment of an integrated circuit with graphene and carbon nanotubes after formation (e.g., by growing, deposition, etc.) of a dielectric layer 501 on the graphene layer, which comprises doped graphene 402 and undoped graphene 401. Dielectric layer 501 may be formed by any appropriate method, including, but not limited to, atomic layer deposition (ALD) or low-temperature chemical vapor disposition (CVD). Dielectric layer 501 may comprise any appropriate oxide material, including, but not limited to, hafnium oxide, silicon oxide, or aluminum oxide.

Figure 6:
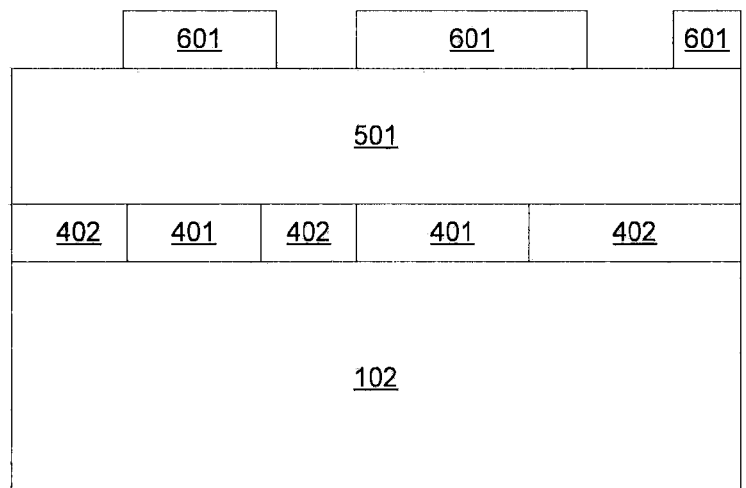
FIG. 6 illustrates a cross section of an embodiment of an integrated circuit comprising graphene and carbon nanotubes after application of mask material to the dielectric layer.

FIG. 6 illustrates a cross section 600 of an embodiment of an integrated circuit comprising graphene and carbon nanotubes after application of mask material 601 to dielectric layer 501. Mask material 601 defines via regions for the integrated circuit. Mask material 601 may comprise any appropriate masking material, including but not limited to PMMA.

Figure 7A:
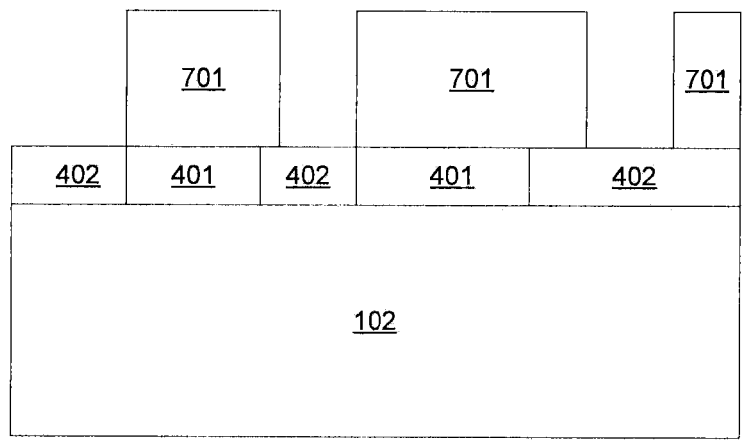
FIGS. 7A and 7B illustrate a cross section and a top view, respectively, of an embodiment of an integrated circuit comprising graphene and carbon nanotubes after etching of the dielectric layer and removal of the mask material.
Figure 7B:
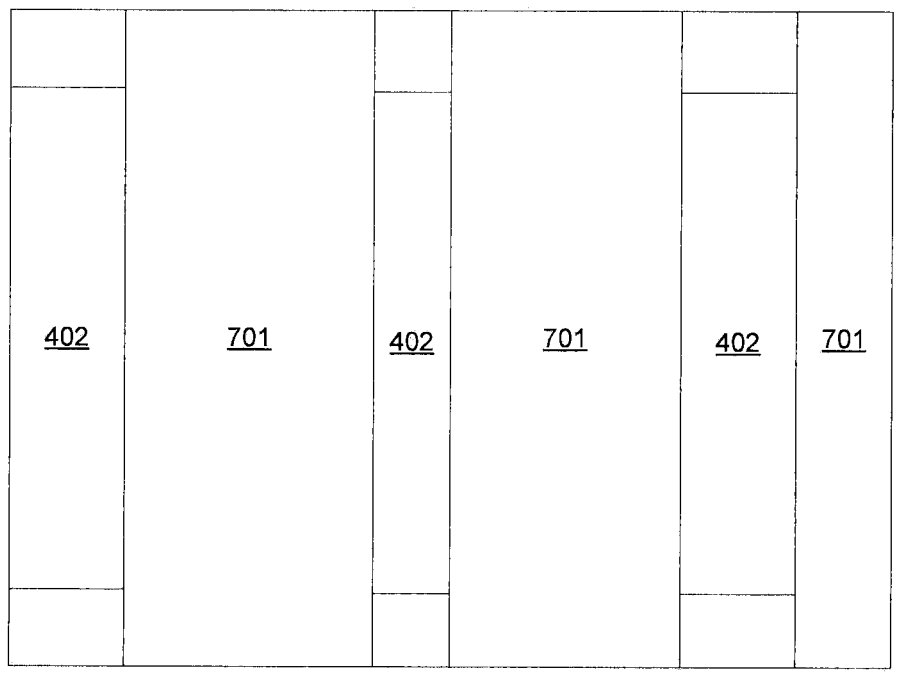

FIGS. 7A and 7B illustrate a cross section 700a and a top view 700b of an embodiment of an integrated circuit comprising graphene and carbon nanotubes after etching of dielectric layer 501 and removal of the mask material 601. The exposed regions of dielectric layer 501 have been etched down to expose doped graphene regions 402. Etching mask 601 is removed after etching of dielectric layer 501 is completed, resulting in dielectric regions 701.

Figure 8:
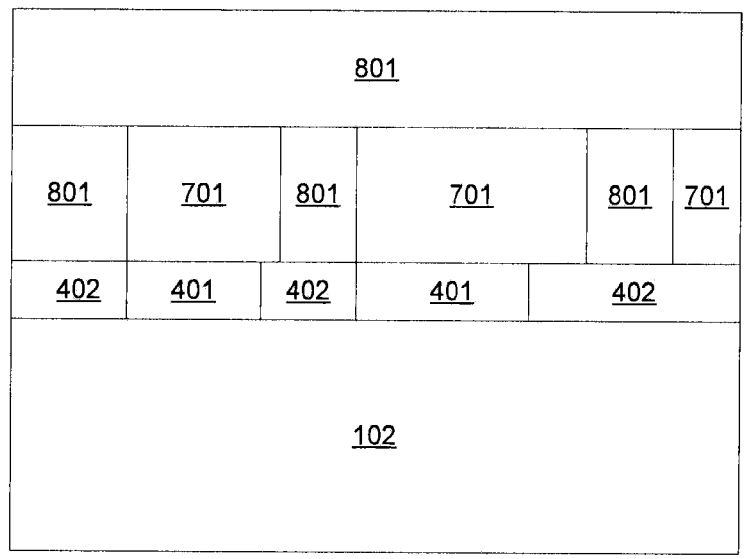
FIG. 8 illustrates a cross section of an embodiment of an integrated circuit comprising graphene and carbon nanotubes after formation of a carbon nanotube film.

FIG. 8 illustrates a cross section 800 of an embodiment of an integrated circuit comprising graphene and carbon nanotubes after formation (e.g., by growing, deposition, etc.) of a carbon nanotube film 801. Carbon nanotube film 801 is disposed on dielectric regions 701 and exposed doped graphene regions 402. Carbon nanotube film 801 may comprise vias and top layer interconnects for the integrated circuit. Carbon nanotube film 801 may be formed by any appropriate process, including but not limited to deposition from a solution or CVD growth.

Figure 9A:
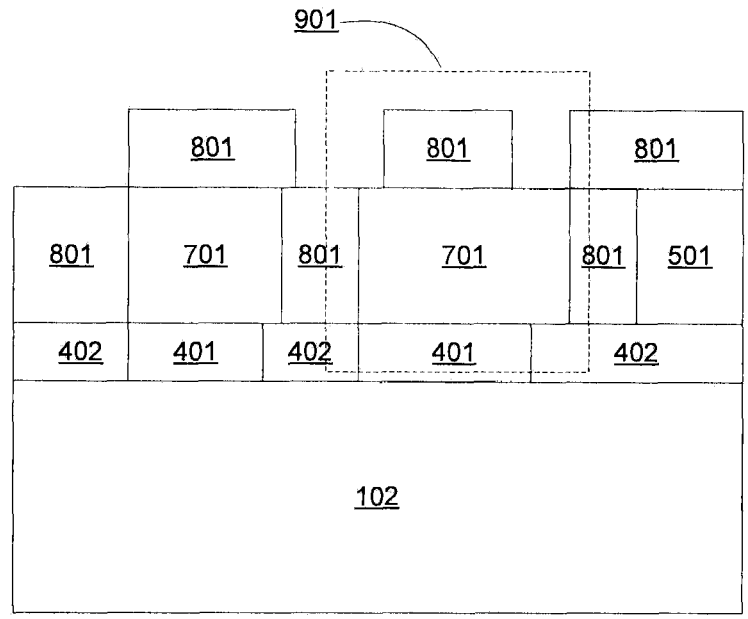
FIG. 9A illustrates a cross section of an embodiment of an integrated circuit comprising graphene and carbon nanotubes after etching of the carbon nanotube film.
Figure 9B:
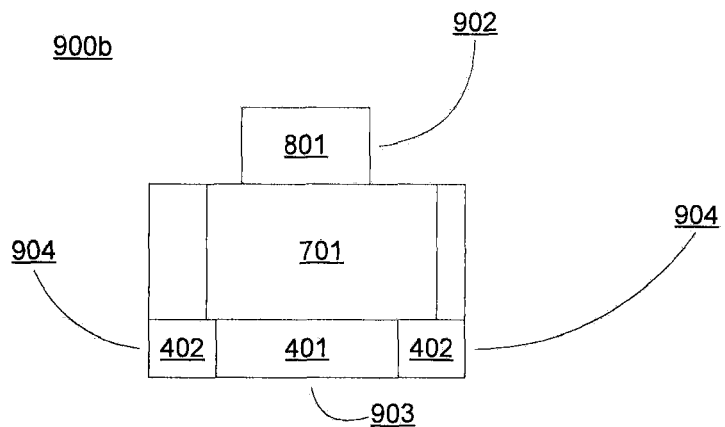
FIG. 9B illustrates an embodiment of a transistor comprising graphene and carbon nanotubes.

FIG. 9A illustrates a cross section of an embodiment of an integrated circuit comprising graphene and carbon nanotubes after etching of carbon nanotube film 801. A mask material (not shown) is applied to carbon nanotube film 801, and the exposed regions of carbon nanotube film 801 are etched down to the top of dielectric regions 701. The mask material (not shown) is then removed. Area 901, which is shown in further detail in FIG. 9B, illustrates an embodiment of a transistor 900b comprising graphene and carbon nanotubes. Transistor 900b comprises a gate 902 comprising carbon nanotube film 801, a channel 903 comprising undoped graphene 401, and contacts 904 comprising doped graphene 402 and carbon nanotube film 801.

Figure 10:
FIG. 10 illustrates a method of fabricating of an integrated circuit comprising graphene and carbon nanotubes.
Figure 10:
Figure 10:
Figure 10:
Figure 10:
Figure 10:

FIG. 10 illustrates a method for fabrication of an integrated circuit comprising graphene and carbon nanotubes. In block 1001, a graphene layer is formed on a substrate, as is shown in FIGS. 1A-B. In block 1002, the graphene is etched, as is shown in FIGS. 2 and 3. In block 1003, a portion of the etched graphene region is doped, as is shown in FIG. 4. In block 1004, a dielectric layer is formed on the graphene layer, as is shown in FIG. 5. In block 1005, the dielectric layer is etched, as is shown in FIGS. 6 and 7A-B. In block 1006, a carbon nanotube film is formed, as is shown in FIG. 8. In block 1007, the carbon nanotube film is etched, as is shown in FIG. 9A, resulting in a completed transistor, as is shown in FIG. 9B.

The technical effects and benefits of exemplary embodiments include an environmentally friendly high performance semiconductor chip that may be transparent and flexible.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. An integrated circuit comprising:
    a graphene layer disposed on a substrate, the graphene layer comprising a region of undoped graphene and a region of doped graphene adjacent the region of undoped graphene, the undoped graphene comprising a channel of a transistor, and the region of doped graphene comprising a contact of the transistor;
    a gate of the transistor disposed over the channel, the gate comprising a first portion of a carbon nanotube film;
    a dielectric layer located on top of the graphene layer and underneath the gate of the transistor, such that the first portion of the etched carbon nanotube film is isolated from the undoped graphene channel by the dielectric layer;

a via formed through the dielectric layer, and filled with a second portion of the carbon nanotube film; and a top level interconnect formed on top of the dielectric layer and in contact with the via, the top level interconnect comprising a third portion of the carbon nanotube film.

2. The integrated circuit of claim 1, wherein the dielectric layer comprises an oxide material.

3. The integrated circuit of claim 1, wherein the graphene layer is between about 0.35 nanometers (nm) and about 7 nm thick.

4. The integrated circuit of claim 1, further comprising a substrate located underneath the graphene layer, the substrate comprising an oxide material.

5. The integrated circuit of claim 1, wherein the doped graphene comprises an organic molecule.

6. The integrated circuit of claim 5, wherein the organic molecule comprises polyethylemneimine.

7. The integrated circuit of claim 5, wherein the organic molecule comprises diazonium.

\* \* \* \* \*